(12) United States Patent
Hoffbauer et al.

(10) Patent No.: US 8,431,815 B2
(45) Date of Patent: Apr. 30, 2013

(54) PHOTOVOLTAIC DEVICE COMPRISING COMPOSITIONALLY GRADED INTRINSIC PHOTOACTIVE LAYER

(75) Inventors: Mark A. Hoffbauer, Los Alamos, NM (US); Todd L. Williamson, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 598 days.

(21) Appl. No.: 12/644,915

(22) Filed: Dec. 22, 2009

(65) Prior Publication Data

US 2011/0146769 A1 Jun. 23, 2011

(51) Int. Cl.
*H01L 31/00* (2006.01)

(52) U.S. Cl.
USPC ............... 136/255; 136/256; 136/262

(58) Field of Classification Search ............ 136/255, 136/262, 256
See application file for complete search history.

(56) References Cited

U.S. PATENT DOCUMENTS

| | | | |
|---|---|---|---|
| 4,780,608 A | 10/1988 | Cross et al. | |
| 6,288,417 B1 | 9/2001 | Nickel et al. | |
| 6,815,730 B2 | 11/2004 | Yamada et al. | |
| 6,881,979 B2 | 4/2005 | Starikov et al. | |
| 7,393,762 B2 | 7/2008 | Hoffbauer et al. | |
| 7,825,328 B2 | 11/2010 | Li | |
| 7,838,869 B2 | 11/2010 | Perera et al. | |
| 2006/0130891 A1* | 6/2006 | Carlson | 136/256 |
| 2007/0023082 A1 | 2/2007 | Manivannan et al. | |
| 2007/0272297 A1 | 11/2007 | Krivoshlykov et al. | |
| 2008/0296609 A1 | 12/2008 | Nagahama et al. | |
| 2008/0308144 A1* | 12/2008 | Shembel et al. | 136/255 |
| 2008/0314447 A1 | 12/2008 | Walukiewicz et al. | |
| 2009/0173373 A1 | 7/2009 | Walukiewicz et al. | |

OTHER PUBLICATIONS

Jani, Omkar, "Development of wide-band gap InGaN solar cells for high efficiency photovoltaics", Aug. 2008, pp. 1-138.*

Notification of Transmittal of the International Search Report and the Written Opinion of the International Searching Authority, or the Declaration issued on Apr. 19, 2011 for corresponding International Application No. PCT/US10/61263 filed on Dec. 20, 2010 (8 pages).

Walukiewicz et al., "Structure and Electronic Properties of InN and In-Rich Group III-Nitride Alloys", J. Phys. D: Appl. Phys. 39 (2006) R83-R99.

(Continued)

*Primary Examiner* — Jonathan Johnson
*Assistant Examiner* — Thanh-Truc Trinh
(74) *Attorney, Agent, or Firm* — Juliet A. Jones

(57) ABSTRACT

Photovoltaic devices and methods of making photovoltaic devices comprising at least one compositionally graded photoactive layer, said method comprising providing a substrate; growing onto the substrate a uniform intrinsic photoactive layer having one surface disposed upon the substrate and an opposing second surface, said intrinsic photoactive layer consisting essentially of $In_{1-x}A_xN$,; wherein:

i. $0 \leq x \leq 1$;
 ii. A is gallium, aluminum, or combinations thereof; and
 iii. x is at least 0 on one surface of the intrinsic photoactive layer and is compositionally graded throughout the layer to reach a value of 1 or less on the opposing second surface of the layer;

wherein said intrinsic photoactive layer is isothermally grown by means of energetic neutral atom beam lithography and epitaxy at a temperature of 600° C. or less using neutral nitrogen atoms having a kinetic energy of from about 1.0 eV to about 5.0 eV, and wherein the intrinsic photoactive layer is grown at a rate of from about 5 nm/min to about 100 nm/min.

7 Claims, 8 Drawing Sheets

OTHER PUBLICATIONS

Phillip et al., "Research Challenges to Ultra-Efficient Inorganic Solid-State Lighting", Laser & Photonics Rev. 1, No. 4, 307-333 (2007).

Miller et al., "Low-Temperature Grown Compositionally Graded INGaN Films", Physica Status Solidi (c) 5, No. 6, 1866-1869 (2008).

Williamson et al., "Highly Luminescent $In_xGa_{1-x}N$ Thin Films Grown Over the Entire Composition Range by Energetic Neutral Atom Beam Lithography & Epitaxy (ENABLE)", Phys. Status Solidi (c) 6, No. 52, S409-S412 (2009).

* cited by examiner

PHOTOVOLTAIC DEVICE COMPRISING COMPOSITIONALLY GRADED INTRINSIC PHOTOACTIVE LAYER

STATEMENT OF FEDERAL RIGHTS

The United States government has rights in this invention pursuant to Contract No. DE-AC52-06NA25396 between the United States Department of Energy and Los Alamos National Security, LLC for the operation of Los Alamos National Laboratory.

FIELD OF THE INVENTION

The present invention relates to higher efficiency photovoltaic devices comprising a compositionally graded intrinsic photoactive layer.

BACKGROUND OF THE INVENTION

Capturing and converting solar photons into electrical current is an inherently inefficient process in semiconductor-based photovoltaic (PV) materials with well-defined band gaps, which correspond to the energy separation between the conduction band and the valence band. To generate charge carriers, photons must have energies larger than the band gap, whereas photons with energies below a material's band gap will generally pass through and not be absorbed. Photon energy in excess of the band gap is lost, and is converted into heat by thermalization. The energy of the photons in the terrestrial solar spectrum spans from about 0.5 to about 4.0 eV with a maximum intensity centered at about 2.6 eV. Thus, for a single photovoltaic material only a small part of the solar spectrum is efficiently absorbed to create charge carriers, with a large fraction of the spectrum wasted by heat generation. Heating and charge transport losses (due to phonon-carrier scattering, annihilation, and scattering of charge carriers at defects) limit efficiencies of single p-n junction photovoltaic devices to about 24% (the maximum theoretical efficiency is about 31%). The average efficiency of currently marketed products is about 12-18%. For multi-junction PV devices based on materials having different band gaps, the highest demonstrated efficiency to date is just over 40%, far below the theoretical 73% efficiency limit.

For the true realization of efficient photovoltaics, the fundamental processes of light absorption over a broad spectral range, carrier generation, carrier separation, and carrier extraction and transport must be simultaneously optimized. The first two processes are heavily influenced by the band structure of the photovoltaic material. The photovoltaic material quality (crystal structure, grains, doping, etc.) determines the efficiency of the other processes.

Over the last decade, the group III-nitrides (GaN, AlN, InN and their alloys) have become one of the most important new classes of semiconductor materials since Si. Indium nitride (InN) was recently discovered to have a band gap of about 0.7 eV. When alloyed with gallium nitride (GaN, band gap 3.4 eV) to produce $In_{1-x}Ga_xN$ thin film alloys (where $0 \leq x \leq 1$) the material would have direct band gaps tunable from about 0.7 to 3.4 eV, which roughly covers the entire terrestrial solar spectrum. However, despite spectacular advances in $In_{1-x}Ga_xN$ film growth for LED device fabrication over the last decade, growing $In_{1-x}Ga_xN$ heterojunctions with an indium or gallium content spanning the entire composition range of 0-100% (and thus suitable for capturing light from the entire solar spectrum) has heretofore not been demonstrated.

InN has a low decomposition temperature (around 550° C.), making it incompatible with high-temperature growth methods such as metal-organic chemical vapor deposition (MOCVD) and molecular beam epitaxy (MBE). Previous attempts at making a wide range of compositions of $In_{1-x}Ga_xN$ films have employed MBE and have met with very limited success, especially for high In-content materials (In greater than ~20%). Using MBE for making compositionally graded $In_{1-x}Ga_xN$ films spanning the entire composition range of 0% to 100% has, in fact, not been possible, nor been demonstrated prior to this work. In general, high-temperature growth conditions (e.g. >850° C. for GaN and >600° C. for InN) present enormous technological barriers for making In-rich $In_{1-x}Ga_xN$-based materials, prohibit the use of inexpensive substrates, and introduce problems with materials stability, composition, phase segregation (e.g., In tends to form "clusters" at high temperatures), and p-type doping.

There exists a need, therefore, for photovoltaic devices made from materials with bandgaps that are tunable over a broad spectral range, that exhibit exceptional photostability, are chemically/thermally stable, are environmentally benign, are radiation tolerant, and are relatively inexpensive. To this end, an additional need exists to optimize the growth of high-quality group-III-nitride semiconductor materials over a broad composition range for use in photovoltaic devices. These same thin film materials would also find general use as solid state light emitting diodes covering the full visible spectral range with high efficiencies, and in other applications.

SUMMARY OF THE INVENTION

The present invention meets the aforementioned needs by describing a new class of higher efficiency photovoltaic (PV) materials and devices ideally suited for capturing the full solar spectrum and providing long-anticipated advancements in efficient PV energy generation. The present invention utilizes the indium-gallium-nitride semiconductor alloys (InGaN) that have previously not been used in photovoltaic devices due to a variety of technical obstacles. In one embodiment, the photovoltaic materials are grown using the ENABLE thin film growth technique, described in U.S. Pat. No. 7,393,762, incorporated herein by reference. For multi-junction PV devices, the efficiency may be at least 50%; for single junction devices, the efficiency may be up to 30%.

The present invention addresses key issues recognized by those skilled in multi-junction solar cells, namely that creating higher efficiency solar cells will be determined by two issues: 1) the use of materials with band gaps covering the entire solar spectrum, and 2) the ability to bring these materials together while maintaining excellent structural, optical, and electrical properties. In particular, the second issue has proven to be the key difficulty in achieving theoretical efficiency limits. Whereas it may be possible to select different materials with band gaps covering much of solar spectrum and stacking them to fabricate multijunction PV devices, when the photoactive layer is not made from a very similar materials system (e.g. the GaN, InN, InGaN system), the topmost layers grown to form multi-junction PV cells are plagued by poor film quality because of lattice and thermal mismatch problems, causing significant degradation in PV cell performance. The use of the ENABLE film growth technology directly addresses these issues, as well as the problems encountered with substrate stability when higher temperature processes are used.

The following describes some non-limiting embodiments of the present invention.

According to a first embodiment of the present invention, a method of making a photovoltaic device comprising at least one compositionally graded photoactive layer is provided, comprising providing a substrate; growing onto the substrate a uniform intrinsic photoactive layer having one surface disposed upon the substrate and an opposing second surface, said intrinsic photoactive layer consisting essentially of $In_{1-x}A_xN$,; wherein:
  i. $0 \leq x \leq 1$;
  ii. A is gallium, aluminum, or combinations thereof; and
  iii. x is at least 0 on one surface of the intrinsic photoactive layer and is compositionally graded throughout the layer to reach a value of 1 or less on the opposing second surface of the layer;
wherein said intrinsic photoactive layer is isothermally grown by means of energetic neutral atom beam lithography and epitaxy at a temperature of 600° C. or less using neutral nitrogen atoms having a kinetic energy of from about 1.0 eV to about 5.0 eV, and wherein the intrinsic photoactive layer is grown at a rate of from about 5 nm/min to about 100 nm/min.

According to another embodiment of the present invention, a photovoltaic device is provided, comprising a transparent substrate; a uniform, compositionally graded, intrinsic photoactive layer having one surface disposed upon the substrate and an opposing second surface, said intrinsic photoactive layer consisting essentially of $In_{1-x}A_xN$,; wherein:
  i. $0 \leq x \leq 1$;
  ii. A is gallium, aluminum, or combinations thereof; and
  iii. x is at least 0 on one surface of the intrinsic photoactive layer and is compositionally graded throughout the layer to reach a value of 1 or less on the opposing second surface of the layer;
a p-type doped active layer region and an n-type doped active layer region, both regions being disposed upon the opposing surface of the intrinsic photoactive layer, such that no portion of the p-type doped active layer region is in direct contact with the n-type doped active layer region; an electrically conductive contact layer disposed upon the p-type doped active layer region and an electrically conductive contact layer disposed upon the n-type doped active layer region; and, a means for conducting electrons from the device to an electrical circuit which is in contact with the conducting contact layers.

DETAILED DESCRIPTION OF THE INVENTION

Figure 1:
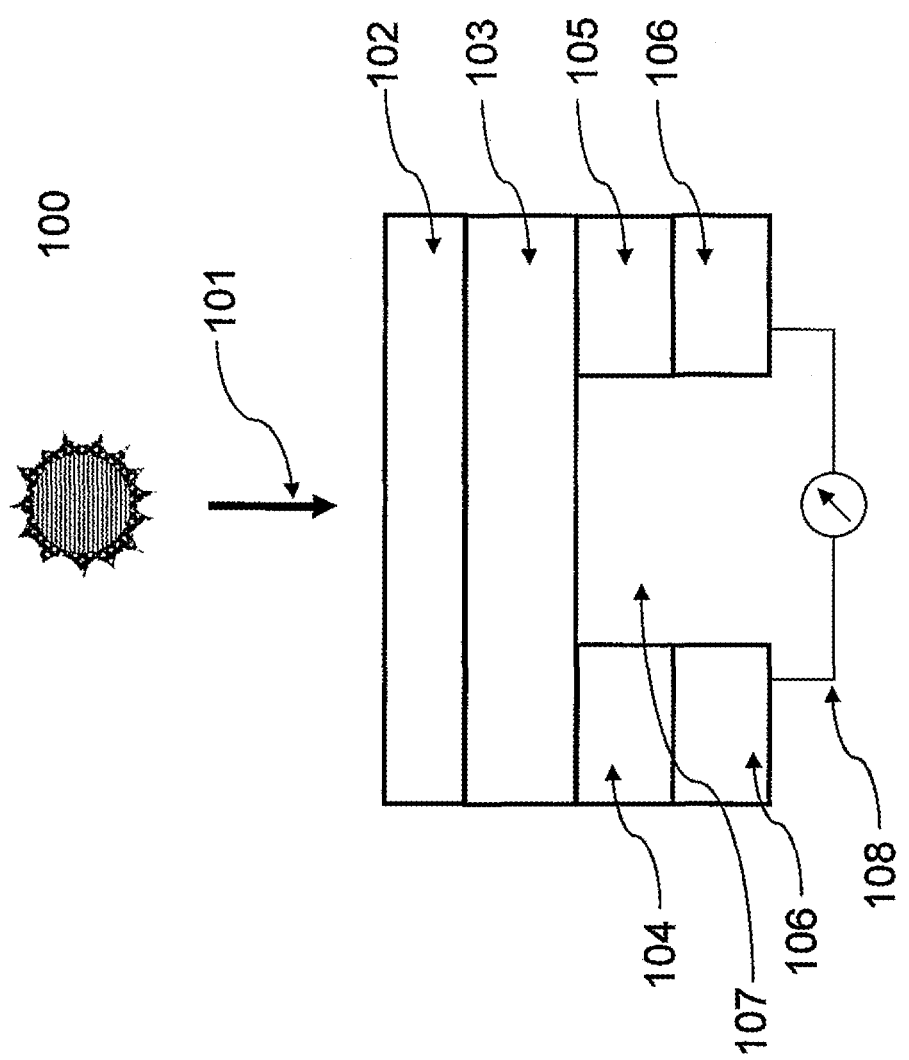
FIG. 1 depicts a cross-sectional side-view of one non-limiting embodiment of the photovoltaic device of the present invention.

The present invention describes photovoltaic devices and methods of making thereof. The devices comprise an intrinsic photoactive layer, or intrinsic layer, consisting essentially of $In_{1-x}A_xN$, wherein A may be gallium and/or aluminum and $0 \leq x \leq 1$. In one embodiment, A is gallium. "Intrinsic," as used herein, means that the photoactive layer is undoped. The value of x can be as low as 0 on a first surface of the intrinsic photoactive layer and up to a value of 1 on the opposing (second) surface of the intrinsic photoactive layer. Alternatively, the value of x can be as low as 0 on the second surface of the intrinsic photoactive layer and up to a value of 1 on the first surface of the intrinsic photoactive layer. The intrinsic photoactive layer of the present invention is compositionally graded, meaning that the value of x may change linearly, non-linearly, gradually, non-gradually, uniformly or non-uniformly throughout the alloy. The intrinsic photoactive layer may additionally be comprised of stacks of compositionally graded layers chosen to maximized device performance. In one preferred embodiment, the value of x may change continuously, meaning that the concentrations of In or A increase or decrease in a substantially uniform manner. In addition, the intrinsic layer is uniform, understood herein to mean characterized by a lack of substructures such as islands, clusters, or other aggregates of similar materials, energy wells, or the like. The photoactive material may have bandgaps from about 0.7 eV to about 3.4 eV. One example of a suitable photoactive material is described in N. Miller et al., Phys. Stat. Sol. (c), vol. 5, no. 6, pp. 1866-1869 (2008), incorporated herein by reference.

In an alternative embodiment, the intrinsic photoactive layer has a first surface and an opposing second surface, and comprises a plurality of discrete layers, as opposed to being compositionally graded. The discrete layers comprise $In_{1-x}A_xN$, wherein the value of x increases or decreases with each successive layer. The layer of the photoactive material nearest to the first surface of the photoactive material may have a value of x of at least 0 (i.e., is essentially made up of InN), in which case the value of x would increase in successive layers approaching the opposing second surface. Alternatively, the layer of the photoactive material nearest to the first surface of the photoactive material may have a value of 1 or less (i.e., is essentially made up of AN), in which case the value of x would decrease in successive layers to a value of at least 0 in the layer nearest to the opposing second surface.

The intrinsic photoactive layer of the present invention has a background carrier concentration (i.e., the concentration of electrons, holes, or other charged species) of from about $1 \times 10^{16}$ cm$^{-3}$ to about $5 \times 10^{19}$ cm$^{-3}$ and a thickness of from about 50 nm to about 5 microns, and in one embodiment the carrier concentration is about $2 \times 10^{17}$ cm$^{-3}$ and the thickness is about 1 micron.

The photovoltaic device of the present invention may be a single-junction device or a multi junction device. Previously, multifunction photovoltaic devices have always relied on more than one active PV material rather than a single, uniform material as described herein or by stacking of materials of varying fixed compositions. When the device is a multi junction device, the efficiency may be at least 50%, and alternatively from about 30% to about 50%. When the device is a single-junction device, the efficiency may be at least 20%, and alternatively from about 10% to about 30%.

A transparent substrate is disposed upon, and in direct contact with, a first surface of the intrinsic photoactive layer. By "transparent" is meant herein that a large fraction of photons having an energy within the energy span of the terrestrial solar spectrum (e.g., from about 0.5 eV to about 4.0 eV) are able to pass freely through the substrate to the photoactive layer. The substrate may comprise a variety of suitable materials that would be known to one of skill in the art, including but not limited to sapphire ($Al_2O_3$), glass, including sodium-free glass, textured zinc oxide, and combinations thereof. The substrate may be crystalline or non-crystalline, and in one preferred embodiment is non-crystalline. The substrate is free from electrical contacts, significant because in contrast to many other photovoltaic device architectures, the absence of contacts permits light to reach the entire area of the photoactive material and not be blocked or reflected away from the substrate surface.

When the photovoltaic device comprises a compositionally graded photoactive material, the photovoltaic device further may comprise a p-type doped active layer region and an n-type doped active layer region. Both doped layer regions are disposed upon and in direct contact with the same surface of the intrinsic photoactive layer. The p-type doped and the n-type doped layer regions may be arranged in any pattern upon the intrinsic photoactive layer (blocks, alternating blocks, comb-like structures, to name a few), provided no portion of the p-type doped active layer region is in direct contact with the n-type doped active layer region. Thus, the present invention is a p-i-n type of PV device, rather than a traditional p-n device in which the p-type doped and the n-type doped layer are disposed on opposing sides of an i active layer. Both layers comprise a material having an equal or lower band gap energy than any portion of the intrinsic photoactive layer. In one embodiment, the p-type doped active layer may comprise InN, InGaN, Si, GaAs, InP, InGaP, ZnO, SiC, or some other p-type semiconductor with a properly chosen bandgap, and the n-type doped active layer may comprise InN, InGaN, Si, GaAs, InP, InGaP, ZnO, SiC, or other n-type doped semiconducting active layers. The p-type doped active layer comprises a p-type dopant, such as magnesium, boron, aluminum, or combinations thereof, whereas the n-type doped active layer comprises an n-type dopant such as silicon, germanium, phosphorous, arsenic, antimony, or combinations thereof. Both dopants may be present in an amount of from about $1 \times 10^{17}$ $cm^{-3}$ to about $1 \times 10^{19}$ $cm^{-3}$. One advantage of the p-type doped region and n-type doped region layers of the present invention is that the doping of the n- and p-type layer regions adjacent to the high electron-mobility InGaN active layer allows photo-generated carriers to be transported from the active layer into an external circuit, eliminating the need for electrodes to be placed on either the substrate or the photoactive materials.

The photovoltaic device comprises electrically conductive contact layers, and a means for conducting electrons from the device to an electrical circuit attached thereto. The electrically conductive layer may be disposed upon and in direct contact with the surface of the p-type doped and n-type doped active layer regions that are not in contact with the intrinsic photoactive layer. One example of a transparent conductive layer used for contacts is indium-tin-oxide (ITO).

FIG. 1 depicts a cross sectional side view of one embodiment of a p-i-n photovoltaic device 100 of the present invention. Solar energy 101 passes through transparent substrate 102 to reach the intrinsic photoactive layer 103, one surface of which is disposed upon and in direct contact with the substrate 102. P-type doped active layer area 104 and n-type doped active layer area 105 both are disposed upon and in direct contact with the intrinsic photoactive layer 103. The electrically conductive contact layer 106 is disposed upon p-type doped active layer area 104 and n-type doped active layer area 105, such that no two portions of electrically conductive contact layer 106 are in direct electrical contact with each other. P-type doped active layer area 104 and n-type doped active layer area 105, and the electrical contact layer 106 are separated by a space 107 so as to prevent direct electrical contact between the doped layers and the contact regions. A means for conducting electrons 108, such as an electrical circuit that would be well-understood by one of skill in the art, is attached to the electrically conductive contact layer 106.

Figure 2:
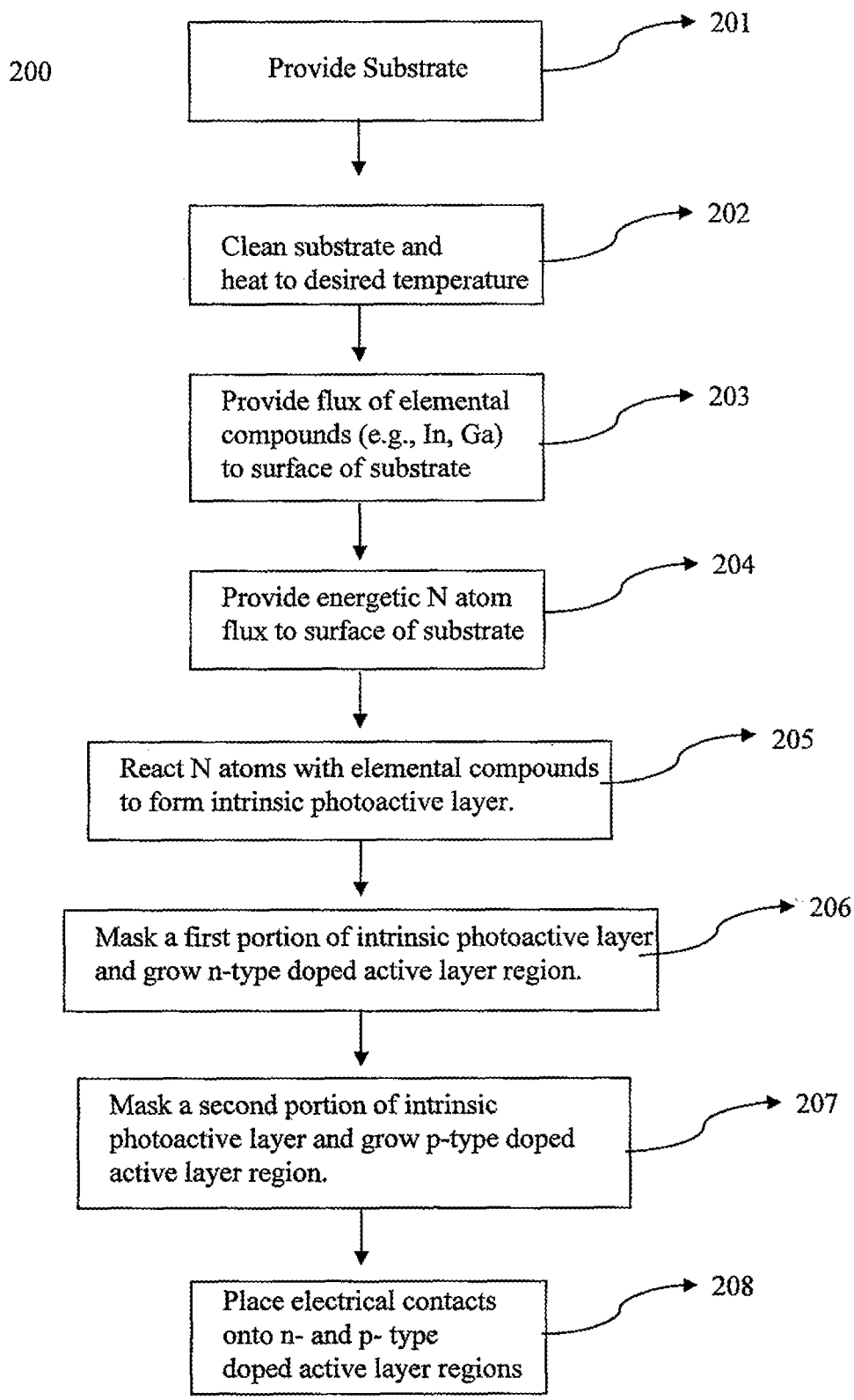
FIG. 2 depicts a flow chart for a method of making the photovoltaic device of the present invention.

The present invention further describes methods of making the photovoltaic device of the present invention (FIG. 2). The method 200 comprises the steps of providing a suitable substrate 201, and of cleaning the substrate and heating to the desired temperature 202. The intrinsic photoactive layer as described herein is grown onto the substrate by means of the energetic neutral atom beam lithography and epitaxy (ENABLE) technique, performed isothermally at a temperature of about 600° C. or less, alternatively of about 700° C. or less, and alternatively at a temperature of about 600° C. to about 700° C. In one embodiment, the ENABLE process is isothermal, understood to mean that the entire film growth process is performed at a single, fixed substrate temperature. The ENABLE process is described in U.S. Pat. No. 7,393,762, issued on Jul. 1, 2008, and incorporated herein by reference. A flux of elemental compounds is provided to the surface of the substrate 203, and, subsequently or concurrently, a flux of energetic N atoms is provided to the surface of the substrate 204. The N atoms react with the elemental compounds to form the intrinsic photoactive layer 205. A first portion of the intrinsic photoactive layer is masked, and an n-type doped active layer region is grown on one or more unmasked portions of the photoactive layer 206. The mask is removed, and a second portion of the intrinsic photoactive layer is then masked, after which a p-type doped active layer region is grown upon the photoactive layer 207. No portion of the p-type and n-type doped active layer regions are in contact with each other, and all are in direct contact with the intrinsic photoactive layer. Note that the order of steps 206 and 207 may be reversed. Finally, electrical contacts are placed onto both the n- and p-type doped active layers 208 (but not in contact with the intrinsic photoactive layer).

ENABLE is different from techniques such as conventional metal-organic chemical vapor deposition (MOCVD) and molecular beam epitaxy (MBE) in that ENABLE utilizes energetic atomic N rather than an ammonia precursor or other sources of reactive nitrogen. Energetic is understood to mean atoms having kinetic energies of from 1.0 to 5.0 eV, preferably in one embodiment between 1.0 and 2.0 eV. The process is carried out at a lower temperature than conventional techniques, which allows growth of InGaN having a high (up to 100%) concentration of In, and also allows, for the first time, the growth of the uniform, compositionally graded photoactive layers of the present invention.

The kinetic energy of the atomic N is critical to achieving a compositionally graded intrinsic photoactive layer $In_{1-x}A_xN$ wherein x is 0% to 100%. One method of achieving N atoms at a suitable kinetic energy is described in U.S. Pat. No. 4,780,608 (Cross et al.). Another critical aspect is the growth rate of the compositionally graded intrinsic photoactive layer, which should be significantly faster than the decomposition rate of the InGaN film when the method of the present invention is followed. In the present invention, the growth rate may be about 100 nm/min, alternatively is from about 5 nm/min to about 100 nm/min, and alternatively is from about 25 nm/min to about 50 nm/min. Also important is keeping the In and, e.g.; Ga total flux constant if a linear change in composition throughout the intrinsic photoactive layer is desired.

In one embodiment, the method may comprise growing a p-type doped layer area and an n-type doped layer area onto the second surface of the intrinsic photoactive layer, as described herein, wherein at least a portion of both the p-type doped layer area and the n-type doped layer area are in direct contact with the same side of the active layer material and wherein no portion of the p-type doped layer area is in direct contact with the n-type doped layer area.

The methods of the present invention further comprise growing an electrically conductive contact layer as described herein onto the p-doped active layer region and onto the n-doped active layer region, and, attaching to the contact layers a means for conducting electrons to an electrical circuit.

EXAMPLES $In_{1-x}Ga_xN$ intrinsic photoactive layers with bandgaps spanning the entire visible wavelength energy range and covering the entire alloy range from InN to GaN were grown by ENABLE, as described in part in U.S. Pat. No. 7,393,762, issued on. Jul. 1, 2008. Important to the growth of high-In content InGaN intrinsic photoactive layers are the following details. At a given temperature, Ga and In react with energetic N atoms at different rates making isothermal growth difficult. The energetic N atoms used for film growth by ENABLE overcome this difficulty by removing the thermal activation barrier. For example, at substrate temperatures of 700° C. and below, InGaN films comprising In content ranging from 0% at least 50% were grown. At a growth temperature of 600° C., InGaN films comprising In content ranging from 0% to 100% were grown. The N atom kinetic energy is below about 5 eV to prevent damage to the growing film by sputtering-type processes. Another important aspect to achieving successful growth of high-In content InGaN intrinsic photoactive layers is the growth rate. Growth rates exceeding about 10 nm/min help to overcome kinetic factors that otherwise cause InGaN layers to preferentially lose In, resulting in poor control of composition. Thus, an ENABLE growth rate typically in the range of about 10 nm/min to more than about 100 nm/min facilitates the rapid growth of InGaN while overcoming the thermal kinetic limitations of other growth techniques. This combination of energetic N atoms, low temperature growth, and high rates is necessary for achieving high-In content InGaN intrinsic photoactive layers of high quality. Additionally, these factors facilitate the successful incorporation of Mg for achieving p-type doping of InGaN layers.

Figure 3:
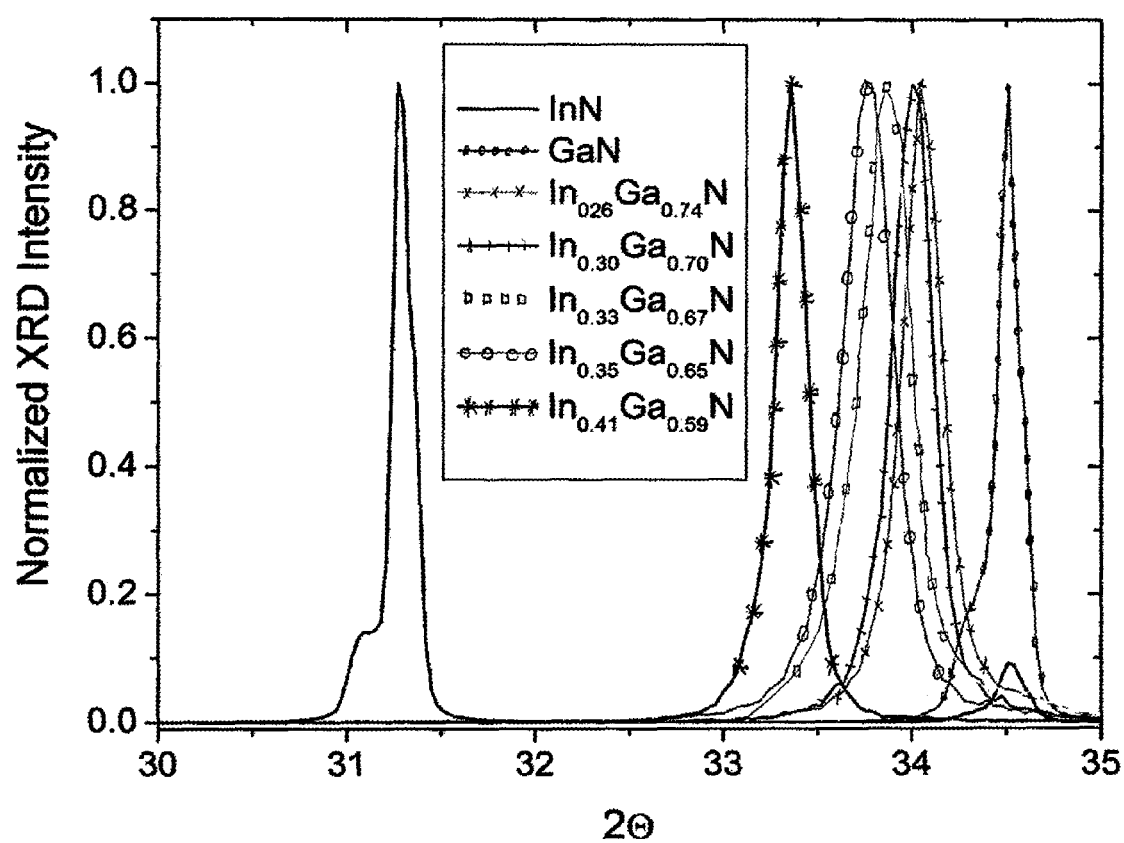
FIG. 3 depicts X-ray diffraction results for ENABLE grown films of pure GaN, pure InN, and a wide range of InGaN compositions with In content ranging from about 22% to 45%.

InGaN intrinsic photoactive layers grown by ENABLE have excellent crystallinity are single-phase uniform alloys, and show no In segregation common to other growth techniques as shown by the x-ray diffraction (XRD) results in FIG. 3. These results show XRD for the <002> diffraction peak for ENABLE grown films of pure GaN, pure InN, and a wide range of InGaN compositions with In content ranging from about 22% to 45%. The films are about 700 nm thick InN, GaN, and InGaN films of the indicated compositions grown by ENABLE on bare sapphire at 700° C. The XRD rocking curve <002> peak width measurements vary from ~2100 arc sec for In0.26Ga0.74N to ~2700 arc sec for In0.41Ga0.59N. The XRD results confirm the InGaN films are not segregated, have a relatively narrow range of compositions in a given film, and have excellent crystallographic alignment.

Despite significant lattice mismatch between GaN and InN and a relatively high density of structural defects common to these nitrides, the epitaxially grown InGaN alloys show optical and electrical properties suitable for PV device applications. These results are in sharp contrast to widely used metalorganic chemical vapor deposition (MOCVD) methods that encounter serious problems with compositional uniformity of $In_{1-x}Ga_xN$ intrinsic photoactive layers with higher than ~20% In content.

Figure 4:
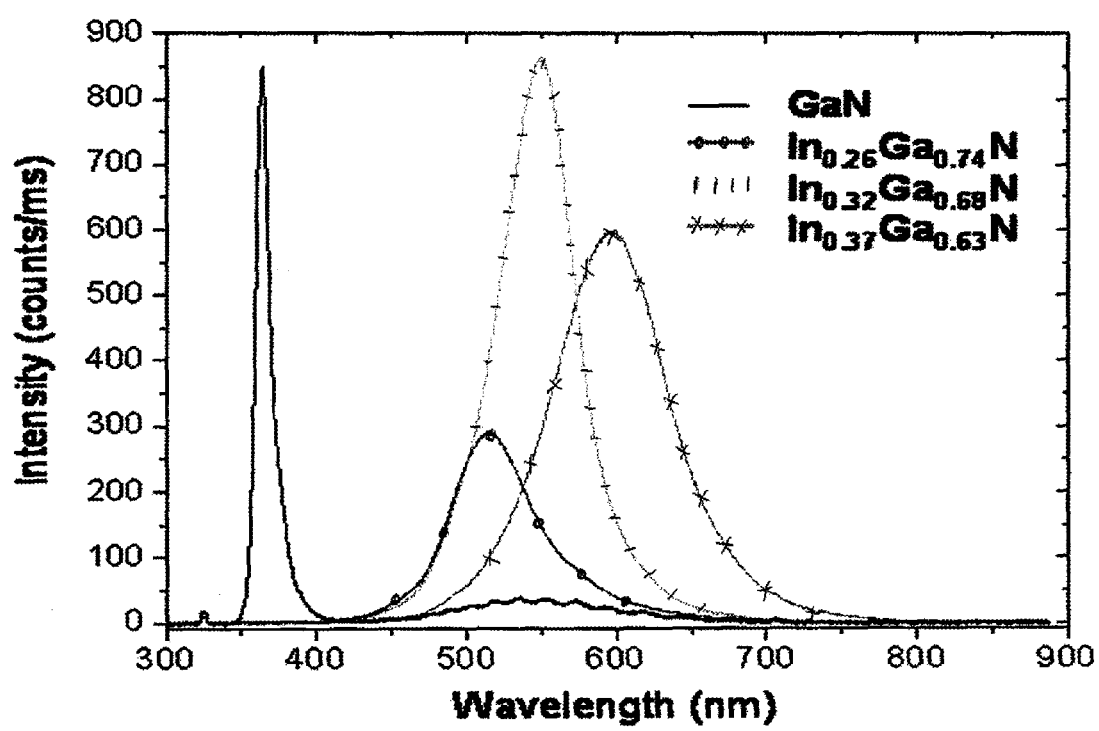
FIG. 4 depicts plots of the photoluminescence (PL) intensity vs. wavelength results for approximately 800 nm thick ENABLE grown InGaN layers, grown on GaN buffer layers, wherein the indium content was varied from about 22% to 45%.
Figure 5:
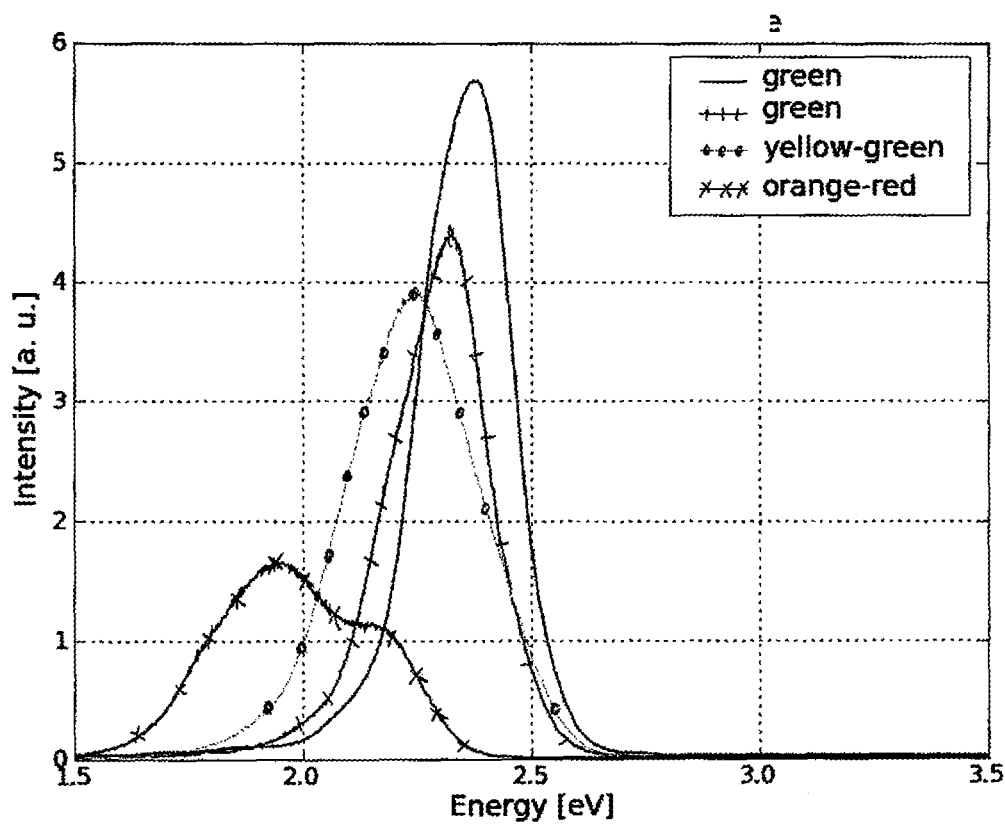
FIG. 5 shows electroluminescence (EL) data vs. energy for similar films as in FIG. 4, confirming successful p-type doping of InGaN of varying compositions grown by ENABLE.

Plots of the absolute photoluminescence (PL) intensity vs. wavelength are shown in FIG. 4 and plots of electroluminescence (EL) intensity vs. energy are shown in FIG. 5. The approximately 800 nm thick InGaN layers were grown at 700° C. on GaN buffer layers, and the indium content was varied from ~22% to 45%. The EL was observed by creating a Schottky barrier/contact with one electrical probe. PL data is also shown for pure GaN films grown by ENABLE in the same way. Noteworthy is the fact that the PL data are all plotted on the same absolute intensity scale. X-ray diffraction (XRD) analysis confirms single peaks for all compositions with typical measured InGaN <002> peak FWHMs of ~940 arc sec, and <002> rocking curve widths of ~1650 arc sec. The bright PL intensities are characteristic of the high film quality of all of the InGaN films that cover a wide range of varying compositions. As the indium content increases, the peak wavelengths shift from 513 to 596 nm or from green to orange-red wavelengths (~2.4 eV to ~2.0 eV). Electroluminescence (EL) data confirms successful p-type doping of InGaN of varying compositions grown by ENABLE. These results are significant in that p-type doping of In-rich InGaN has been considered technologically difficult. Electrical measurements showed carrier mobilities of 20 to >100 $cm^2$/Vs (with donor concentration in the low $10^{17}/cm^3$ range).

Figure 6:
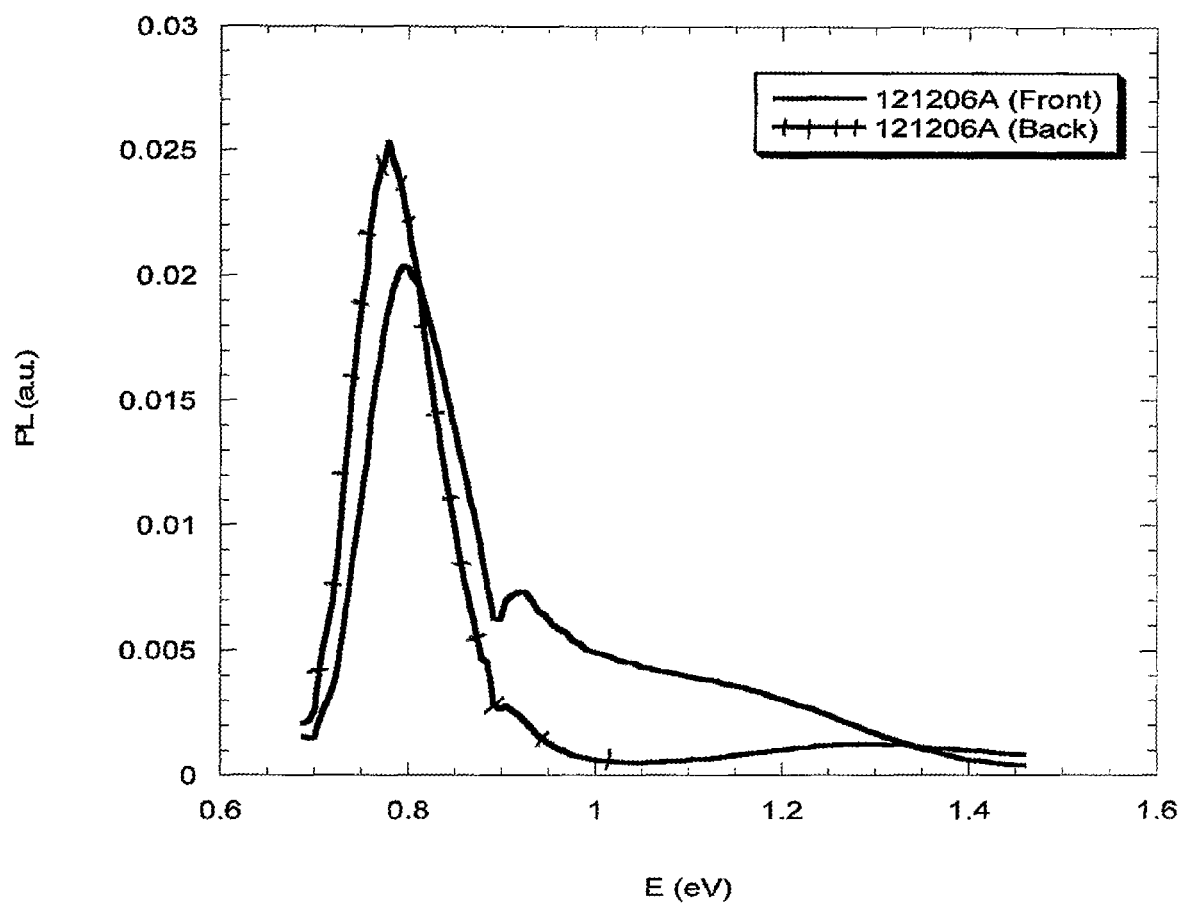
FIG. 6 shows PL intensity at 0.77 eV dominated by InN bandgap emission with both front and backside illumination, for compositionally graded $In_xGa_{1-x}N$ intrinsic photoactive layers where the In composition was graded starting with pure GaN and grading to InN and starting with pure InN and grading to GaN (e.g $x=0$ to $x=1$ and for $x=1$ to $x=0$).
Figure 7:
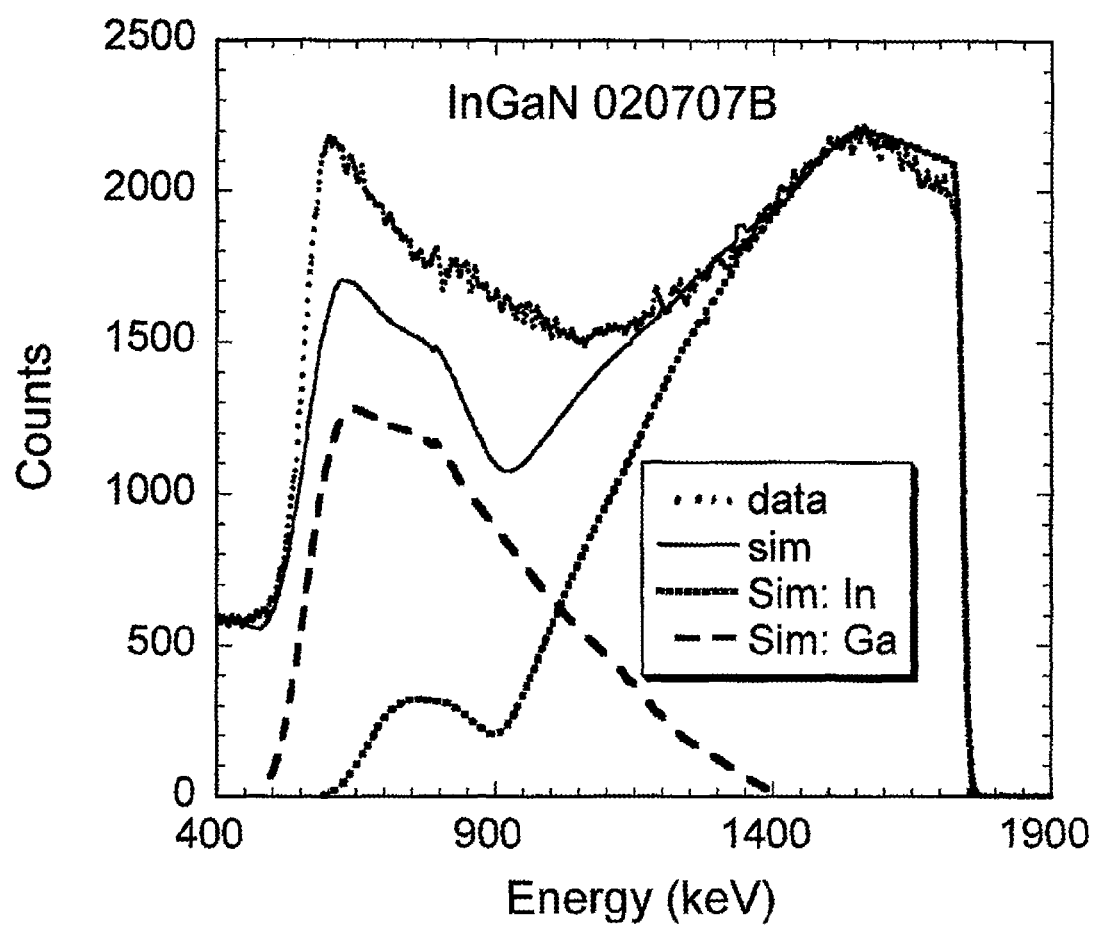
FIG. 7 shows Rutherford backscattering (RBS) measurements and modeling of the films of FIG. 6.
Figure 8:
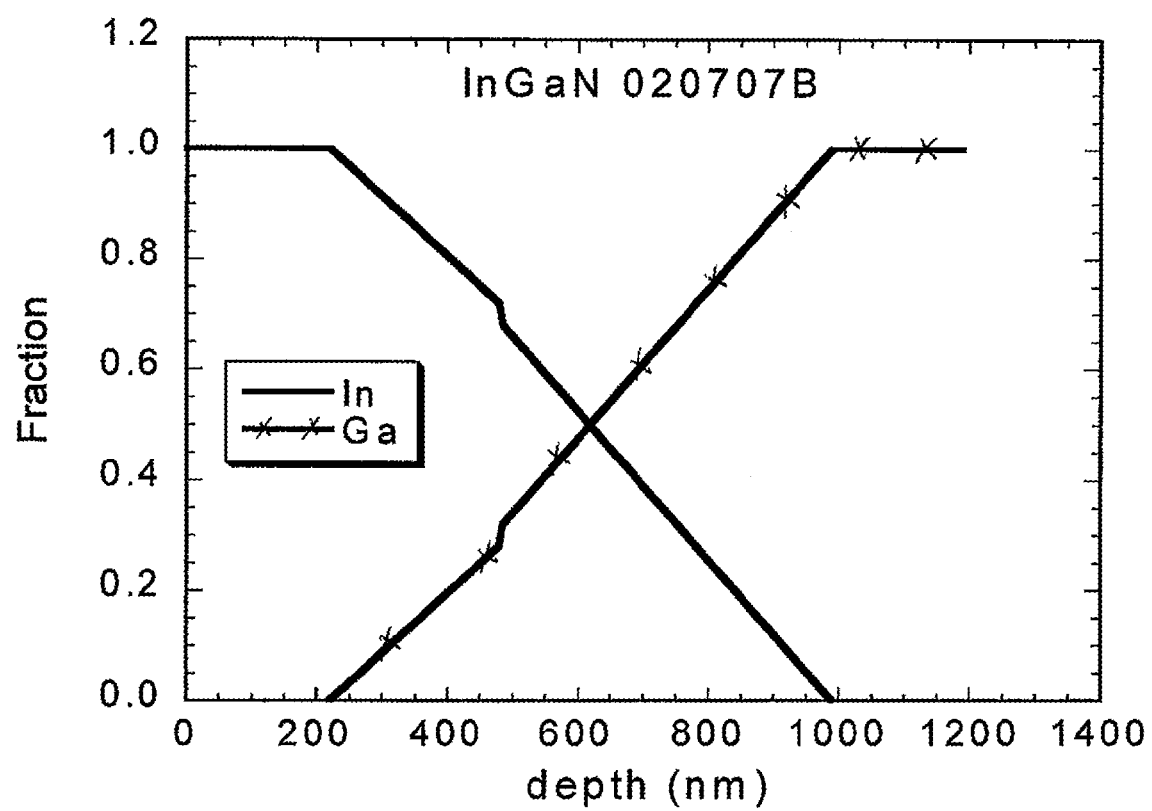
FIG. 8 shows a modeled fit to RBS data of FIG. 7, showing smooth composition transitions achieved by controlling total metal flux during growth.

Additional experiments have been performed growing compositionally graded $In_xGa_{1-x}N$ intrinsic photoactive layers where the In composition was graded starting with pure GaN and grading to InN and starting with pure InN and grading to GaN (e.g x=0 to x=1 and for x=1 to x=0) (FIGS. 6, 7 and 8). The films were about 800 nm thick film and grown at 600° C. on a 200 nm thick GaN buffer layer with a 200 nm InN capping layer. FIG. 6 shows strong PL at 0.77 eV dominated by InN bandgap emission with both front and backside illumination. FIG. 7 shows Rutherford backscattering (RBS) measurement of film composition, and FIG. 8 is a modeled fit to RBS data showing smooth composition transitions achieved by controlling total metal flux during growth. In this case, isothermal growth at 600° C. made possible using ENABLE resulted in graded InGaN intrinsic photoactive layers that showed physical and optical characteristics consistent with good film quality, uniform and smooth grading of the layer composition, and optical properties suitable for PV devices. These structural, PL, EL, and transport data clearly demonstrate the advantages of using ENABLE to generate the active InGaN films for full-spectrum InGaN-based PV devices. The importance of low temperature isothermal growth, and high growth rates for overcoming kinetics for achieving high-In content InGaN are critical. In addition, it is important to keep the total In and Ga metal flux constant when growing graded InGaN films to achieve a smooth (nearly linear) change in composition throughout the film thickness.

All documents cited in the Detailed Description of the Invention are, in relevant part, incorporated herein by reference; the citation of any document is not to be construed as an admission that it is prior art with respect to the present invention. To the extent that any meaning or definition of a term in this document conflicts with any meaning or definition of the same term in a document incorporated by reference, the meaning or definition assigned to that term in this document shall govern.

Whereas particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A photovoltaic device comprising:
   a transparent substrate;
   a uniform, compositionally graded, intrinsic photoactive layer having one surface disposed upon the substrate and an opposing second surface, said intrinsic photoactive layer comprising $In_{1-x}A_xN$; wherein:
   i. $0 \leq x \leq 1$;
   ii. A is gallium, aluminum, or combinations thereof; and
   iii. x is at least 0 on one surface of the intrinsic photoactive layer and is compositionally graded throughout the layer to reach a value of 1 or less on the opposing second surface of the layer;
   a p-type doped active layer region and an n-type doped active layer region, both regions being disposed upon the opposing second surface of the intrinsic photoactive layer, such that no portion of the p-type doped active layer region is in direct contact with the n-type doped active layer region;
   an electrically conductive contact layer disposed upon the p-type doped active layer region and an electrically conductive contact layer disposed upon the n-type doped active layer region, such that no portion of the electrically conductive contact layer disposed upon the p-type doped active layer region is in contact with any portion of the electrically conductive contact layer disposed upon the n-type doped active layer region; and,
   a conductor to conduct electrons to an electrical circuit and in contact with the conducting contact layer.

2. The photovoltaic device of claim 1, wherein the p-doped active layer region and the n-doped active layer region each comprise a material having a lower band gap energy than the intrinsic photoactive layer.

3. The photovoltaic device of claim 1, wherein A is gallium.

4. The photovoltaic device of claim 1, wherein the intrinsic photoactive layer comprises a bandgap ranging from about 0.7 eV to about 3.4 eV.

5. The photovoltaic device of claim 1, wherein the photovoltaic device is a multi junction photovoltaic device and has an efficiency of at least 50%.

6. The photovoltaic device of claim 1, wherein the photovoltaic device is a multi junction photovoltaic device and has an efficiency of from about 30% to about 50%.

7. The photovoltaic device of claim 1, wherein the device is a single-junction photovoltaic device and has an efficiency of from about 10% to about 30%.

* * * * *